United States Patent [19]
Co et al.

[11] Patent Number: 5,631,587
[45] Date of Patent: May 20, 1997

[54] FREQUENCY SYNTHESIZER WITH ADAPTIVE LOOP BANDWIDTH

[75] Inventors: Ramon S. Co, Trabuco Canyon; Howard C. Yang, Milpitas, both of Calif.

[73] Assignee: Pericom Semiconductor Corporation, San Jose, Calif.

[21] Appl. No.: 321,430

[22] Filed: Oct. 11, 1994

Related U.S. Application Data

[63] Continuation-in-part of Ser. No. 237,593, May 3, 1994, abandoned.

[51] Int. Cl.⁶ ............................ H03L 7/16; H03L 7/00
[52] U.S. Cl. ........................... 327/107; 331/25; 455/260
[58] Field of Search ..................... 375/371, 373, 375/374, 375, 376; 331/1 A, 1 R, 8, 10, 17, 25; 327/105, 107; 455/183.1, 260, 264

[56] References Cited

U.S. PATENT DOCUMENTS

| | | | |
|---|---|---|---|
| 4,677,648 | 6/1987 | Zurfluh | 375/376 |
| 4,901,033 | 2/1990 | Herold et al. | 331/1 A |
| 4,912,434 | 3/1990 | Wyatt | 331/17 |
| 5,151,665 | 9/1992 | Wentzler | 331/8 |
| 5,254,958 | 10/1993 | Flach et al. | 375/376 |
| 5,319,320 | 6/1994 | Abe et al. | 331/1 A |
| 5,381,085 | 1/1995 | Fischer | 331/44 |

*Primary Examiner*—Curtis Kuntz
*Assistant Examiner*—Paul Loomis
*Attorney, Agent, or Firm*—Townsend and Townsend and Crew LLP

[57] ABSTRACT

A method for a frequency synthesizer with adaptive loop bandwidth is disclosed, which is adjusted by the improved frequency synthesizer includes a phase-locked loop and a phase-locked loop adjustment circuit. The phase-locked loop has loop characteristics including a loop bandwidth, a natural frequency, a damping factor, and the like. The phase-locked loop adjustment circuit is adjusted in response to a change in output frequency.

17 Claims, 7 Drawing Sheets

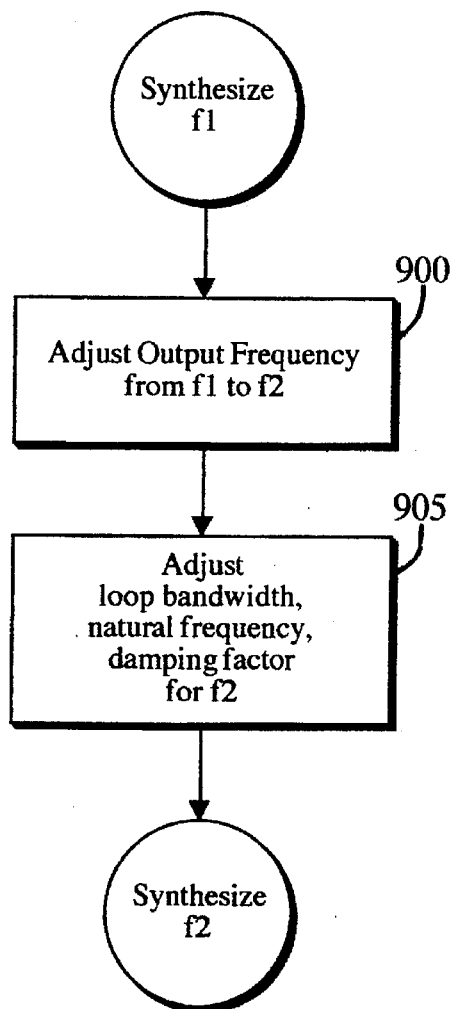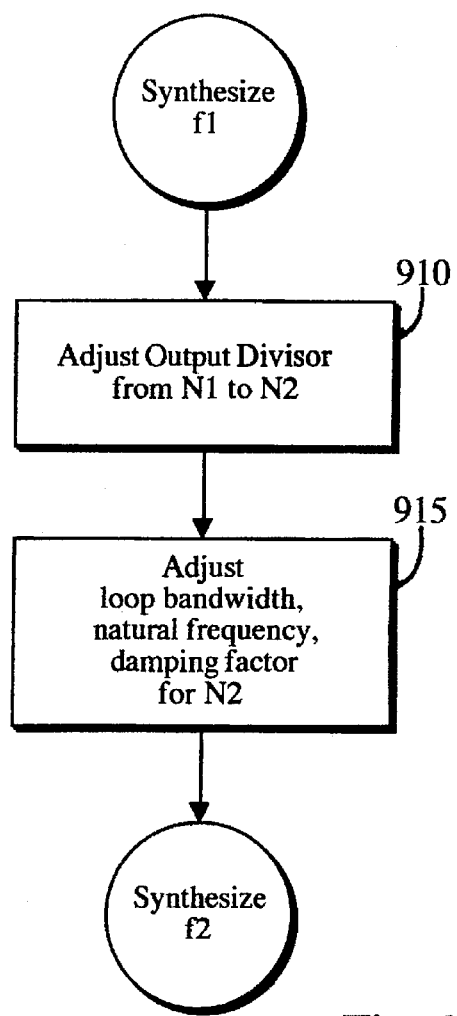
Fig. 7
Fig. 8

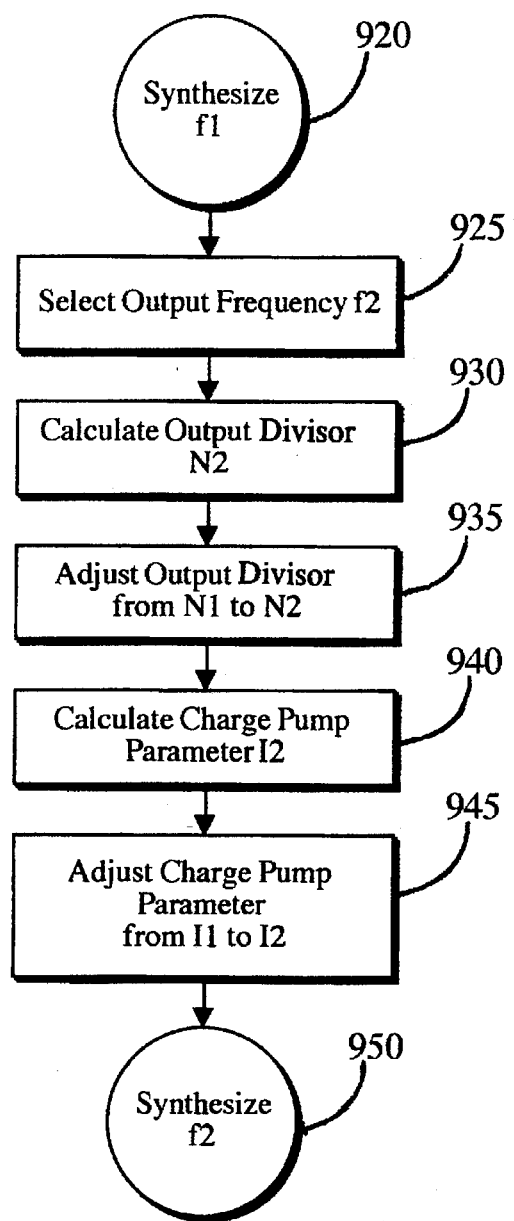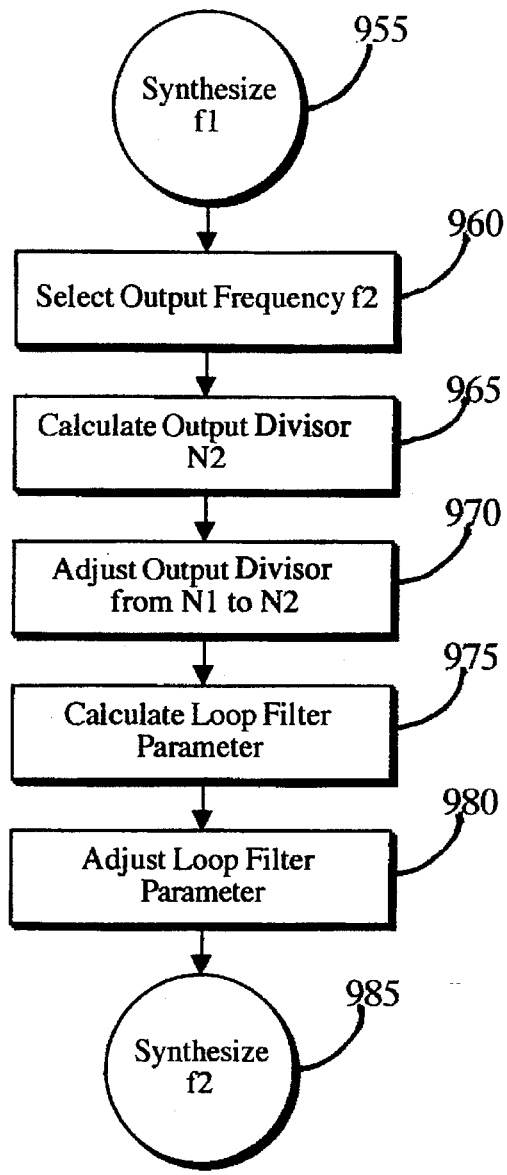
Fig. 9
Fig. 10

FREQUENCY SYNTHESIZER WITH ADAPTIVE LOOP BANDWIDTH

CROSS-REFERENCE TO RELATED APPLICATIONS

The present invention is a continuation-in-part of application Ser. No. 08/237,593 filed May 3, 1994, now abandoned.

BACKGROUND OF THE INVENTION

The present invention relates generally to frequency synthesizers which are used to generate multiple clock frequencies, and more specifically to a frequency synthesizer based upon phase-locked loop technology.

A frequency synthesizer having a phase-locked loop typically includes an input frequency divider for a corresponding input signal and an output frequency divider for its corresponding output signal. At phase-lock, a synthesized frequency $f_o$ is proportional to the input frequency $f_i$ by the relationship shown in equation (1), where M and N are divisors for the input frequency divider and output frequency divider, respectively.

$$f_o = \frac{N}{M} f_i \qquad (1)$$

From equation (1), it can be seen that a desired output frequency which is, for example, double the current output frequency is obtained by adjusting variables such as input frequency $f_i$, divisor M, and/or divisor N. If $f_i$ and M are constant, the dividend N is doubled to obtain the desired output frequency. Alternatively, if $f_i$ and N are normally held constant, the divisor M is halved to obtain the desired output frequency. A wide range of output frequencies may be calculated by varying the values of the divisors M and N in equation (1).

However, the practical limit of the output frequency range is often defined by dynamic loop characteristics underlying the phase-locked loop. The loop characteristics include loop variables such as loop bandwidth, natural frequency, damping factor, among others. Values of the loop characteristics are typically based upon preset parameters of component parts for the phase-locked loop. The preset parameters typically prevent frequency synthesis outside a predefined range of the phase-locked loop.

When a frequency synthesizer attempts to synthesize a frequency within the frequency range of the phase-locked loop, the frequency synthesis will typically succeed. However, when a frequency synthesizer attempts to synthesize a frequency outside the predefined frequency range, the synthesis will often fail.

From the above it is seen that a frequency synthesizer which includes a phase-locked loop adapted to provide a larger range of synthesized frequencies is often desired.

SUMMARY OF THE INVENTION

The present invention provides an improved frequency synthesizer with adaptive loop bandwidth and methods for adapting the loop bandwidth therefore. In the present invention, when an output frequency for a frequency synthesizer is adjusted, a phase-locked loop (PLL) in the frequency synthesizer will also be adjusted to the new output frequency. By adjusting the PLL, the range of frequencies generated by this improved frequency synthesizer is larger than the frequency range generated by the conventional frequency synthesizer.

In a specific embodiment, the frequency synthesizer includes a phase-locked loop that generates an output signal at an output frequency in response to an input signal at an input frequency. The phase-locked loop includes dynamic loop characteristics such as a loop bandwidth, a natural frequency, a damping factor, among others. The frequency synthesizer also includes a phase-locked loop adjustment circuit that varies the loop bandwidth, natural frequency, and damping factor of the phase-locked loop to conform the phase-locked loop to the output frequency.

In an alternative embodiment, the phase-locked loop includes an output frequency divider, a phase detector, a charge pump, a loop filter, and a variable oscillator. The desired output frequency is selected by setting an output divisor in the output frequency divider. Such output frequency divider divides the output signal by the output divisor to produce a divided output signal at a divided output frequency. The phase detector receives the divided output signal and input signal, and detects the phase difference between the signals to produce a difference signal. On the basis of the difference signal and a charge pump parameter, the charge pump produces a charge pump signal. The loop filter filters out high-frequency components from the charge pump signal and produces a filtered signal. The variable oscillator receives the filtered signal and produces the output signal at the output frequency in response to the filtered signal. The frequency synthesizer also includes a phase-locked loop adjustment circuit that receives the output divisor and adjusts the charge pump parameter in response to the output divisor.

A further alternative embodiment includes an improved method for adjusting an output signal of a frequency synthesizer from a first output frequency to a second output frequency. The improved method includes the steps of adjusting the output frequency of a phase-locked loop from the first frequency to the second frequency, and adjusting the phase-locked loop bandwidth, natural frequency, and damping factor from values corresponding with the first frequency to values corresponding with the second frequency.

Still further, an embodiment includes an improved method for adjusting the loop bandwidth, the natural frequency, and damping factor of a phase-locked loop in a frequency synthesizer. The improved method includes the steps of selecting a second output frequency for the phase-locked loop and calculating a second output divisor for an output frequency divider in the phase-locked loop in response to the second output frequency. The method also includes changing the output divisor from a divisor associated with a first output frequency to the second output divisor and calculating a second pump parameter for a charge pump circuit of the phase-locked loop circuit in response to the second output divisor. A step of changing the pump parameter from a pump parameter associated with the first output frequency to the second pump parameter is also included.

A further understanding of the nature and advantages of the invention may be realized by reference to the remaining portions of the specification and drawings.

BRIEF DESCRIPTION OF THE DRAWINGS

FIG. 7 is a flowchart of steps in an embodiment of the frequency synthesizer according to the present invention;

FIG. 8 is a flowchart of steps in another embodiment of the frequency synthesizer according to the present invention; and FIG. 9 is a flowchart of steps in another embodiment of the frequency synthesizer according to the present invention.

FIG. 10 illustrates another embodiment of a method for adjusting the output frequency and the loop bandwidth, natural frequency, and damping factor of a PLL in a frequency synthesizer;

DESCRIPTION OF SPECIFIC EMBODIMENTS

Figure 1:
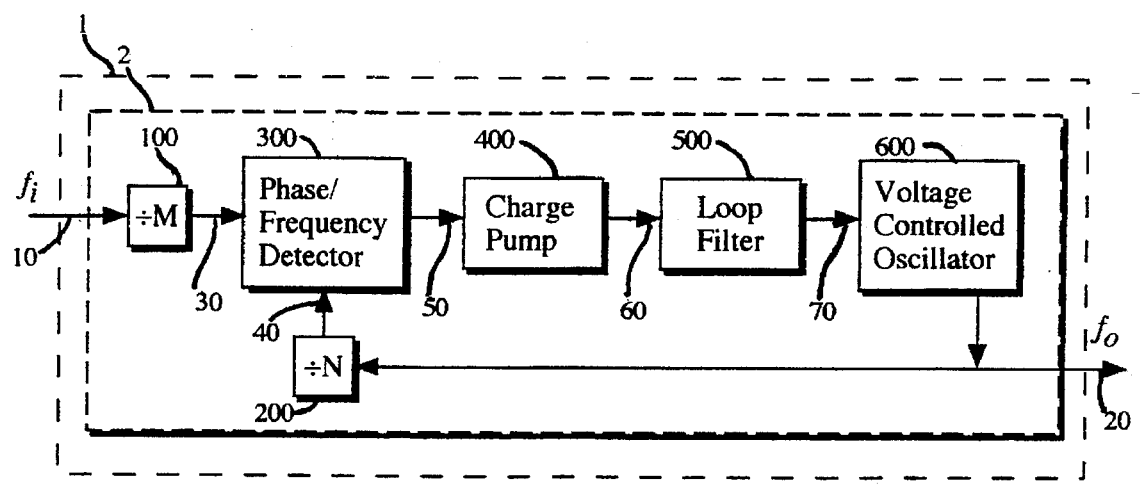
FIG. 1 is a block diagram of a conventional frequency synthesizer.

A block diagram of a conventional frequency synthesizer 1 incorporating a phase-locked loop (PLL) 2 is illustrated in FIG. 1. An input signal on signal line 10, to the frequency synthesizer 1 has a frequency of $f_i$, and the synthesized output signal on signal line 20, from the frequency synthesizer 1 has a frequency of $f_o$. The input frequency $f_i$ is divided by an input frequency divider 100 having an input divisor M, and the output frequency $f_o$ is divided by an output frequency divider 200 having an output divisor N. The values of M and N are user-programmable and are commonly integers. The relationship between the output frequency $f_o$ is related to the input frequency $f_i$ by the relationship in equation (2).

$$f_o = \frac{N}{M} f_i \qquad (2)$$

In a phase/frequency detector 300, the phase of a divided input signal on signal line 30, and the phase of a divided output signal on signal line 40, are compared. The phase/frequency detector 300 produces a difference signal on signal line 50, that is related to the amount of time the divided input signal on signal line 30, leads the divided output signal on signal line 40, or to the amount of time the divided input signal on signal line 30, lags the divided output signal on signal line 40.

A charge pump 400 can be embodied as a current pump or a voltage pump. Based upon the difference signal on signal line 50, the charge pump 400 delivers a charge pump signal on signal line 60, of zero magnitude or magnitude I. The charge pump signal on signal line 60, is positive I⁺ or a negative I⁻ depending on the difference signal on signal line 50.

The charge pump signal on signal line 60, is subsequently filtered by a loop filter 500, typically a low pass filter. An illustrative low pass filter has the impedance Z(s) as shown in equation (3). At low operating frequencies, the capacitor C will dominate the impedance, and at high operating frequencies, the resistor R will dominate the impedance.

$$Z(s) = R + \frac{1}{Cs} \qquad (3)$$

A variable oscillator 600 can be embodied as a voltage-controlled oscillator (VCO) or a current-controlled oscillator. In FIG. 1, a VCO is illustrated. The VCO receives the filtered signal on signal line 70, and oscillates in response to the filtered signal. The VCO has an associated gain factor represented by $K_o$. The output oscillation of the VCO 600 is the output signal on signal line 20. When the frequency synthesizer 1 is phase-locked, the output signal on signal line 20, will be locked at the desired output frequency $f_o$.

The dynamic performance of the PLL 2 can be represented by loop characteristics such as a loop bandwidth K, a natural frequency $\omega_n$, a damping factor $\zeta$, among others. These loop characteristics are related to values of components in the PLL such as the charge pump magnitude I, the resistance R and capacitance C of the loop filter, the gain factor $K_o$ of the VCO, and the input divisor M and output divisor N. Equations (4)–(6) illustrate the relationships.

$$K = \frac{K_o}{N} \cdot \frac{I}{2\pi} RM \qquad (4)$$

$$\omega_n = \sqrt{\frac{K_o}{N} \cdot \frac{I}{2\pi C} M} \qquad (5)$$

$$\zeta = \frac{R}{2} \sqrt{\frac{K_o}{N} \cdot \frac{IC}{2\pi} M} \qquad (6)$$

The values for components for the PLL 2 in the frequency synthesizer 1, such as I, R, C, and $K_o$ are held constant whereas the values of M and N can be adjusted to synthesize a different output frequency.

If the value of the output divisor N is halved, from equation (2) it can be seen that the output frequency $f_o$ should be halved. A problem arises in the PLL 2 however, because of the relationship of N to the loop characteristics illustrated in equations (4)–(6). If, for example, the value of the output divisor N is quadrupled it can be seen that the loop bandwidth is K quartered, the natural frequency $\omega_n$ is halved, and the damping factor $\zeta$ is also halved. A problem with this, for example, is that by halving the damping factor, the PLL may become underdamped causing an unstable output frequency. Because the PLL loop characteristics vary in response to M and N according to equations (4)–(6) and not to equation (2), the variation tends to limit the output frequency range of the frequency synthesizer 1.

Figure 2:
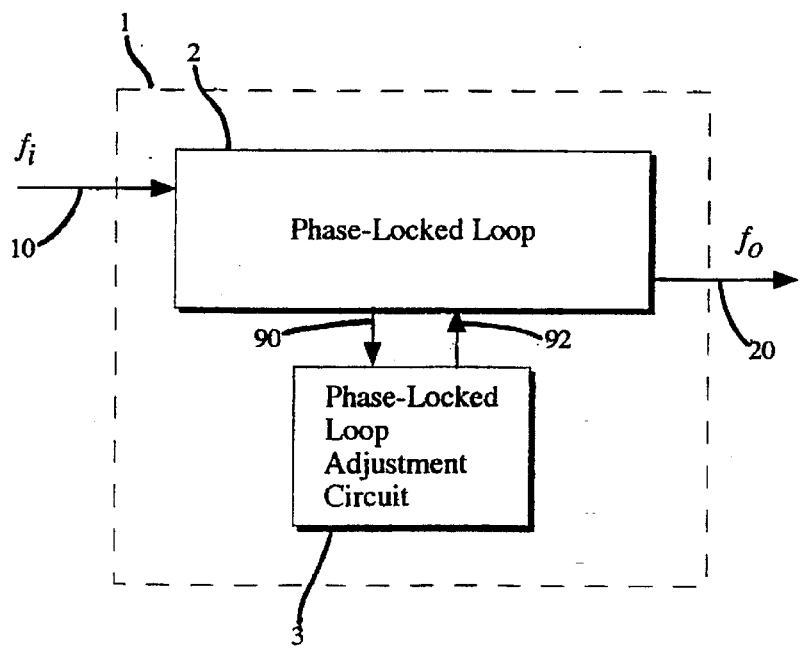
FIG. 2 is a block diagram of an embodiment of the frequency synthesizer according to the present invention.

FIG. 2 illustrates a block diagram that represents an embodiment of the present invention. In addition to the PLL 2, a phase-locked loop adjustment circuit 3 is incorporated into the frequency synthesizer 1 and coupled to the PLL 2 via signal line 90 and signal line 92. The phase-locked loop adjustment circuit 3 is used to adjust the loop bandwidth, the natural frequency, and the damping factor of the PLL 2, for the output frequency $f_o$ of the frequency synthesizer 1.

Figure 3:
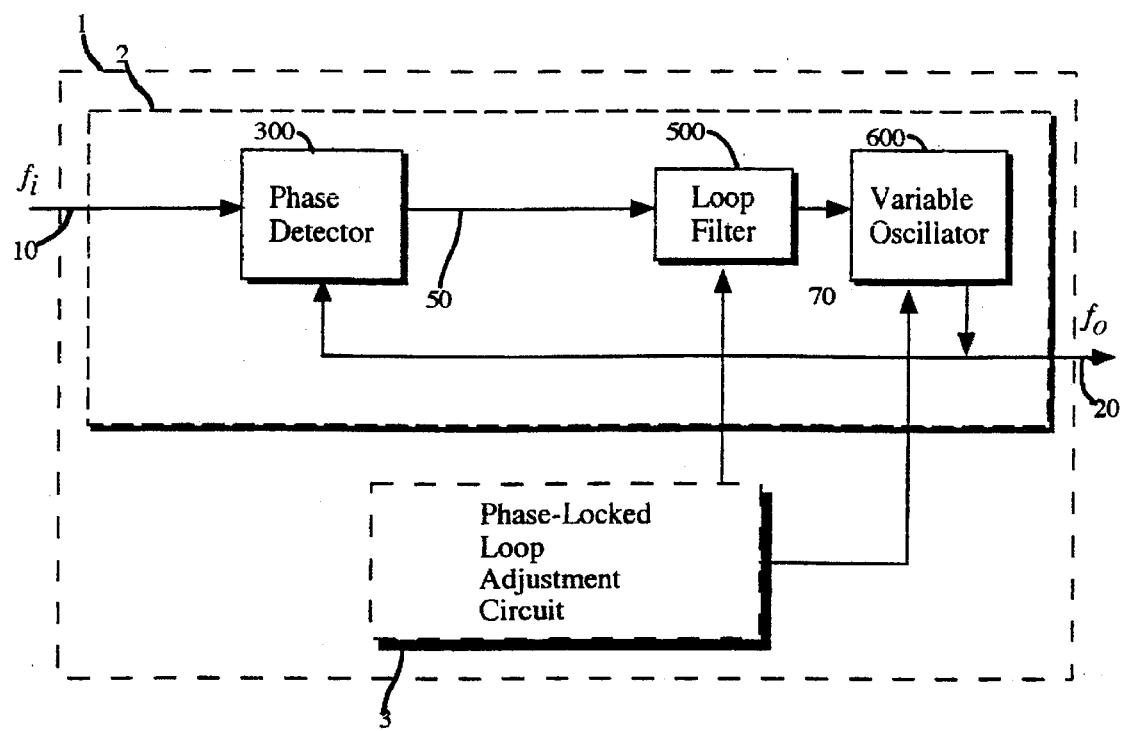
FIG. 3 is a block diagram of another embodiment of the frequency synthesizer according to the present invention.

FIG. 3 illustrates a block diagram that represents another embodiment of the present invention. The PLL 2 includes a phase detector 300, a loop filter 500, and a variable oscillator 600. The loop filter 500 includes an adjustable filter parameter that alters the characteristics of the loop filter, and the variable oscillator 600 includes an adjustable oscillator parameter $K_o$ that alters the characteristics of the variable oscillator. The phase-locked loop adjustment circuit 3 is coupled to the loop filter 500 and the variable oscillator 600. For a given output frequency $f_o$, the phase-locked loop adjustment circuit 3 adjusts the value of the filter parameter and the oscillator parameter, for example $K_o$, in order to adapt the PLL 2 for the output frequency of the frequency synthesizer 1.

Figure 4:
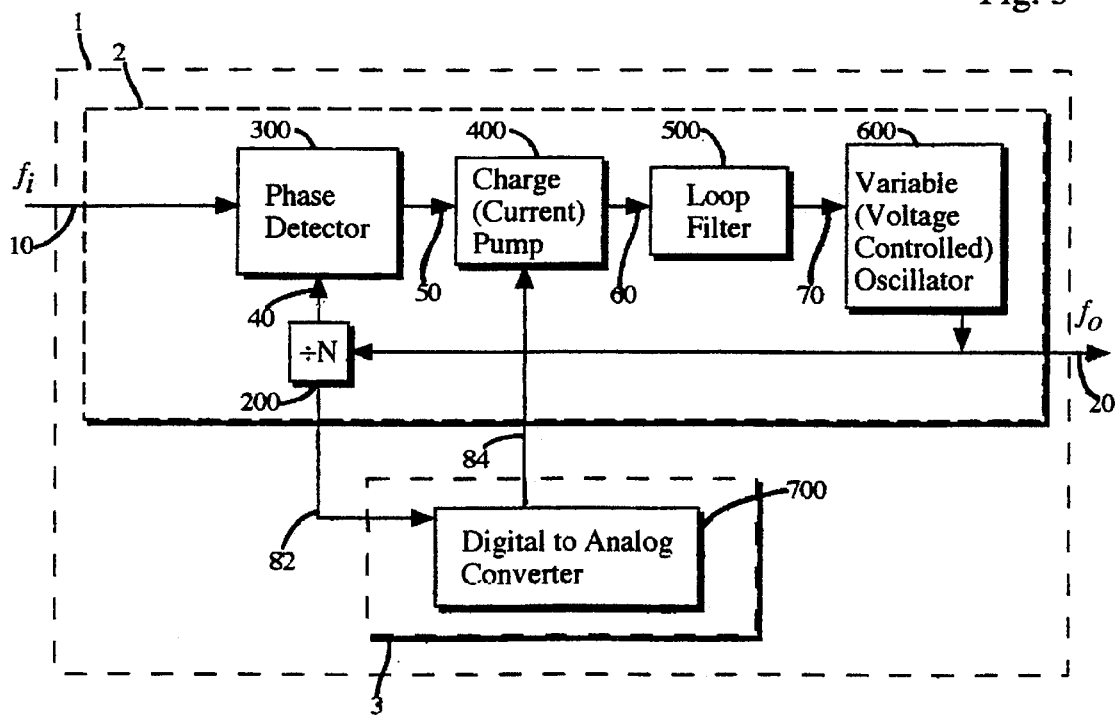
FIG. 4 is a block diagram of another embodiment of the frequency synthesizer according to the present invention.

FIG. 4 illustrates a block diagram that represents another embodiment of the present invention. In this embodiment, the PLL 2 includes an output divider 200 with output divisor N, a phase detector 300 coupled to the output divider 200 via signal line 40, a current pump 400 coupled to phase detector 300 via signal line 50, a loop filter 500 coupled to the current pump 400 via signal line 60, and a voltage-controlled oscillator 600 coupled to the loop filter 500 via signal line 70 and to output divider 200 via signal line 20. The current pump 400 includes an adjustable pump parameter that alters the characteristics of the current pump. The phase-locked loop adjustment circuit 3 is coupled to the output divider 200 via signal line 82, to receive the output divisor N and to the current pump 400 via signal line 84, to adjust the value of a pump parameter I, in response to the output divisor N. In a preferred embodiment, the phase-locked loop adjustment circuit 3 is a digital to analog converter (DAC) 700.

In operation, for example, from equations (4)–(7), when the output divisor N is quadrupled the loop bandwidth K is quartered, the natural frequency $\omega_n$ is halved, and the damping factor $\zeta$ is also halved. In order to maintain the damping factor $\zeta$ relatively constant, such that the PLL 2 is not over-damped or under-damped, the magnitude of the pump parameter I, should be quadrupled. Thus if the value of N is quadrupled and the magnitude of I is also quadrupled, the damping factor $\zeta$ and the loop bandwidth K will both be held relatively constant.

Figure 5:
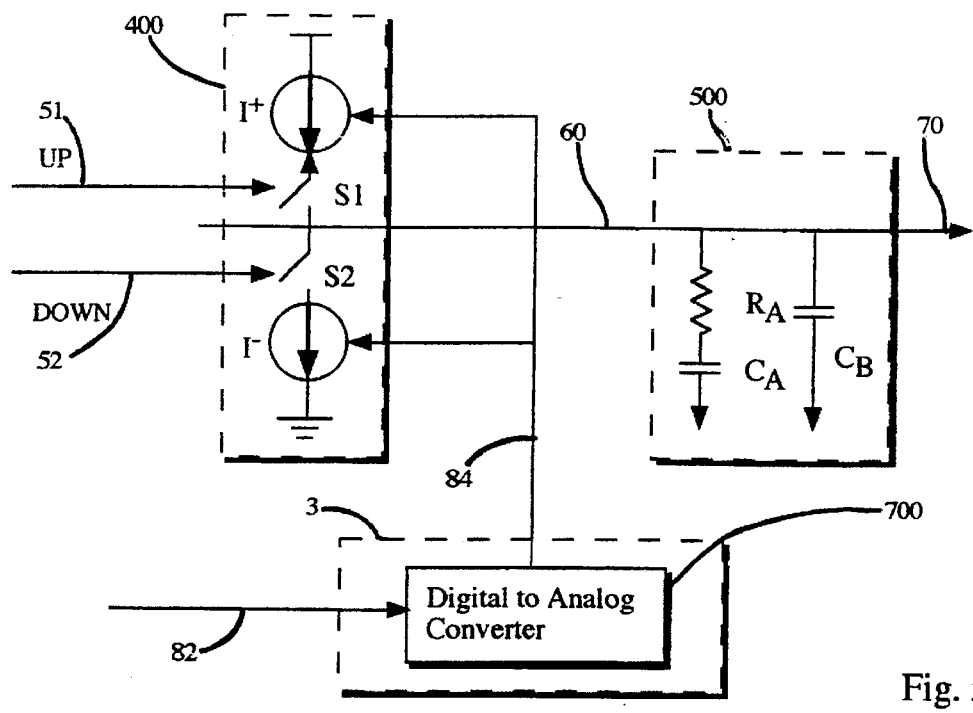
FIG. 5 is a circuit diagram of a portion of an embodiment of the frequency synthesizer according to the present invention.

FIG. 5 illustrates a diagram that represents a portion of an embodiment illustrated in FIG. 4, including a current pump 400 coupled to a loop filter 500 via signal line 60, and an embodiment of the phase-locked loop adjustment circuit 3, a digital to analog converter 700 coupled to the current pump 400 via signal line 84. The current pump 400 is coupled to a phase detector 300 (not shown) having output signal UP on signal line 51 and DOWN on signal line 52, representing a phase lead signal or a phase lag signal. The digital to analog converter 700 is coupled to an output divider 200 (not shown) having an output divisor N on signal line 82.

In operation, when the phase detector 300 detects that the input signal on signal line 10, leads the divided output signal on signal line 40, the phase detector asserts an UP signal 51, and when the input signal on signal line 10, lags the divided output signal on signal line 40, the phase detector asserts a DOWN signal 52. In the current pump 400, switch S1 is closed when UP is asserted and switch S2 is closed when DOWN is asserted. Current source $I^+$ is coupled to the charge pump output on signal line 60, only when switch S1 is closed, and current source $I^+$ is coupled to the charge pump output on signal line 60, only when switch S2 is closed.

The magnitude of $I^+$ and $I^-$ are variable according the output of the digital to analog converter 700 on signal line 84, based upon the output divisor N. With the addition of the adjustable current sources $I^+$ and $I^-$, the charge pump parameter I in equations (4)–(6) can be adjusted to adjust the PLL loop bandwidth, natural frequency, damping factor, among others.

The loop filter 500 is illustrated in an embodiment including a resistor $R_A$ having a value R, a first capacitor $C_A$ having value C, and a second capacitor $C_B$ having value $C_2$. When the value of $C_2 \gg C$, the impedance Z of the loop filter can be simplified to that of equation (2). The values for R and C are the same parameters used in equations (4)–(6).

In an alternative embodiment of the present invention, it can easily be seen that the value $K_o$ can be adjusted, instead of I, in response to a change in the output divisor N, to adjust the PLL loop characteristics.

Figure 6:
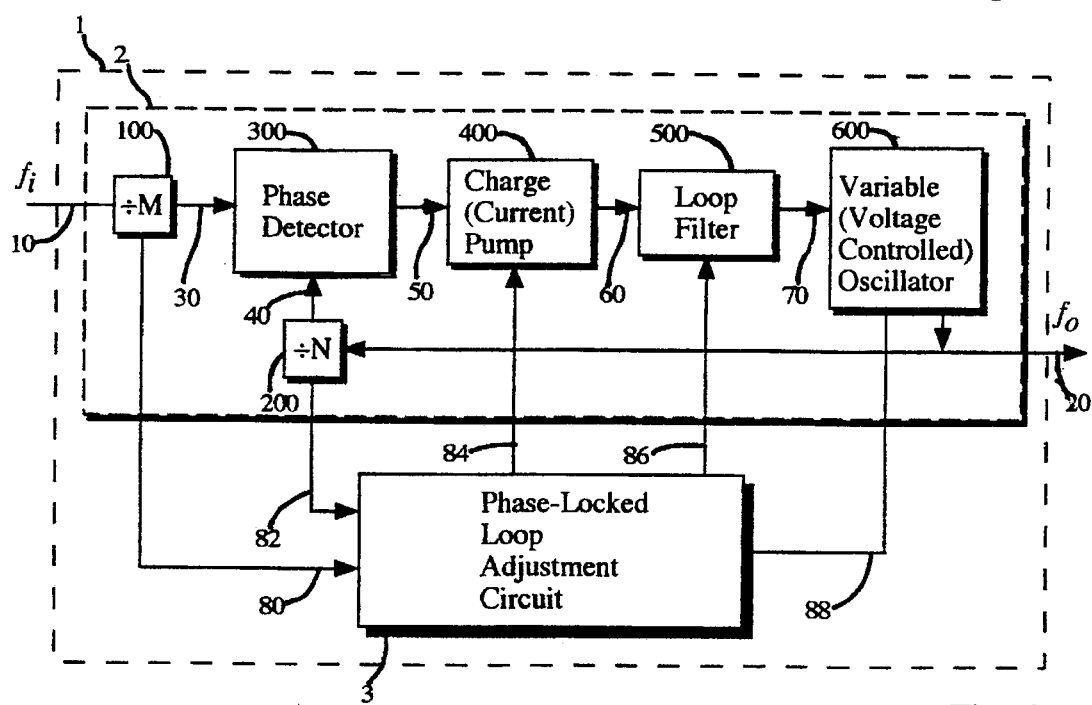
FIG. 6 is a block diagram of another embodiment of the frequency synthesizer according to the present invention.

FIG. 6 illustrates a block diagram that represents another embodiment of the present invention. In this embodiment, the PLL 2 includes an input frequency divider 100, an output frequency divider 200, a phase detector 300 coupled to the input frequency divider 100 via signal line 30 and to the output frequency divider 200 via signal line 40, a current pump 400 coupled to phase detector 300 via signal line 50, a loop filter 500 coupled to the current pump 400 via signal line 60, and a variable oscillator 600 couple to the loop filter 500 via signal line 70. The current pump 400 includes an adjustable pump parameter, I, that alters the characteristics of the current pump, the loop filter 500 includes an adjustable filter parameter, R or C, that alters the characteristics of the loop filter, and the variable oscillator 600 includes an adjustable oscillator parameter, $K_o$, that alters the characteristics of the variable oscillator. The phase-locked loop adjustment circuit 3 is coupled to the input frequency divider 100 via signal line 80, to the output frequency divider 200 via signal line 82, to the current pump 400 via signal line 84, to the loop filter 500 via signal line 86, and to the variable oscillator 600 via signal line 88. For a given output frequency $f_o$, the phase-locked loop adjustment circuit 3 adjusts the value of the pump parameter I, filter parameter R or C, and the oscillator parameter $K_o$ in order to adapt the PLL for the input divisor N and the output divisor M.

In an alternative embodiment, it can be easily envisioned that a subcombination of the charge pump 400, the loop filter 500, or the variable oscillator 600 can be coupled to the phase-locked loop adjustment circuit 3 for adjustment of the respective parameters.

The flowchart in FIG. 7 illustrates an embodiment of the basic method for adjusting the output signal of a frequency synthesizer from a first output frequency $f_1$ to a second output frequency $f_2$. In step 900, the desired output frequency of the frequency synthesizer is adjusted from a first to a second output frequency, and in step 905, the loop bandwidth K, the natural frequency $\omega_n$, and the damping factor $\zeta$ are adjusted to adapt the PLL to the second output frequency $f_2$.

The flowchart in FIG. 8 illustrates an embodiment of another basic method for adjusting the output signal of a frequency synthesizer from a first output frequency $f_1$ to a second output frequency $f_2$. In step 910, the output divisor N is adjusted from a first output divisor $N_1$ to a second output divisor $N_2$, and in step 915, the loop bandwidth K, the natural frequency $\omega_n$, and the damping factor $\zeta$ are adjusted to adapt the PLL to the second output divisor $N_2$.

FIG. 9 illustrates another embodiment of a method for adjusting the output frequency and the loop bandwidth, natural frequency, and damping factor of a PLL in a frequency synthesizer. In step 920, the frequency synthesizer synthesizes an output signal having a first output frequency $f_1$. In step 925, a second output frequency $f_2$ is selected for the output signal, and in step 930, an adjusted output divisor $N_2$ is calculated. In step 935, the output divisor of an output divider is adjusted from an output divisor $N_1$ associated with the first output frequency $f_1$ to the adjusted output divisor $N_2$. Based upon the adjusted output dividend $N_2$, an adjusted charge pump parameter $I_2$ is calculated to adjust the PLL loop bandwidth, natural frequency, and damping factor in step 940. In step 945, the charge pump parameter in the charge pump circuit is adjusted from a charge pump parameter $I_1$ associated with the first output frequency $f_1$ to the adjusted charge pump parameter $I_2$. After the adjustments have been made, the frequency synthesizer is adapted to synthesize the output signal having a second output frequency $f_2$, step 950.

FIG. 10 illustrates another embodiment of a method for adjusting the output frequency and the loop bandwidth, natural frequency, and damping factor of a PLL in a frequency synthesizer. In step 955, the frequency synthesizer synthesizes an output signal having a first output frequency $f_1$. In step 960, a second output frequency $f_2$ is selected for the output signal, and in step 965, an adjusted output divisor $N_2$ is calculated. In step 970, the output divisor of an output divider is adjusted from an output divisor $N_1$ associated with the first output frequency $f_1$ to the adjusted output divisor $N_2$. In step 975, based upon the adjusted output dividend $N_2$, loop filter parameters are calculated to adjust the PLL loop bandwidth, natural frequency, and damping factor, and in step 980 the loop filter parameters in the loop filter are adjusted. After the adjustments have been made, the frequency synthesizer is adapted to synthesize the output signal having a second output frequency $f_2$, step 985.

Figure 11:
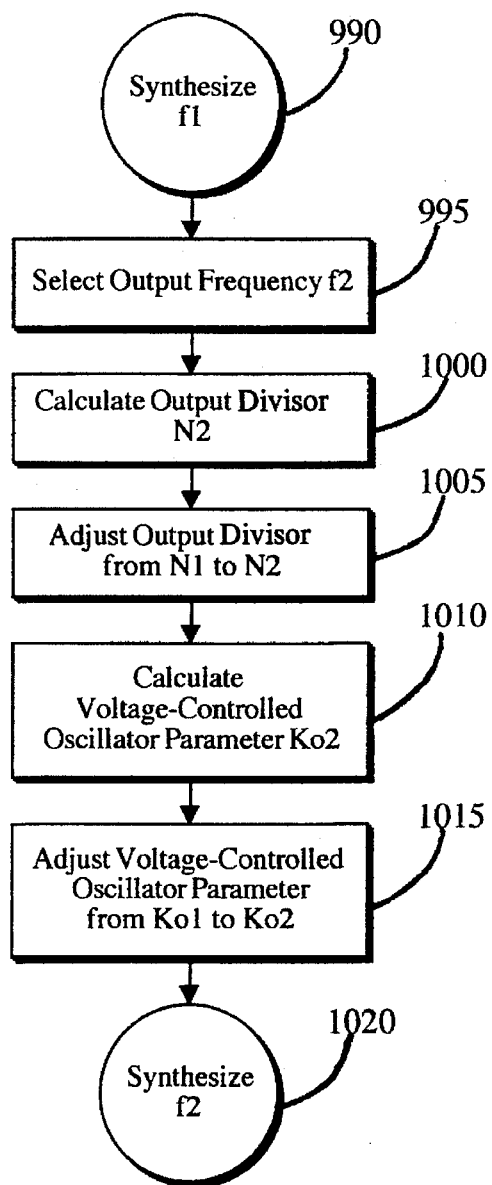
FIG. 11 illustrates another embodiment of a method for adjusting the output frequency and the loop bandwidth, natural frequency, and damping factor of a PLL in a frequency synthesizer.

FIG. 11 illustrates another embodiment of a method for adjusting the output frequency and the loop bandwidth, natural frequency, and damping factor of a PLL in a frequency synthesizer. In step 990, the frequency synthesizer synthesizes an output signal having a first output frequency $f_1$. In step 995, a second output frequency $f_2$ is selected for the output signal, and in step 1000, an adjusted output divisor $N_2$ is calculated. In step 1005, the output divisor of an output divider is adjusted from an output divisor $N_1$ associated with the first output frequency $f_1$ to the adjusted output divisor $N_2$. Based upon the adjusted output dividend $N_2$, the voltage-controlled oscillator parameter $K_o$ is calculated to adjust the PLL loop bandwidth, natural frequency, and damping factor in step 1010. In step 1015, the voltage-controlled oscillator parameter $K_o$ in the loop filter is adjusted from a voltage-controlled oscillator parameter $K_{o1}$ associated with the first output frequency $f_1$ to the adjusted voltage-controlled oscillator parameter $K_{o2}$. After the adjustments have been made, the frequency synthesizer is adapted to synthesize the output signal having a second output frequency $f_2$, step 1020.

Figure 12:
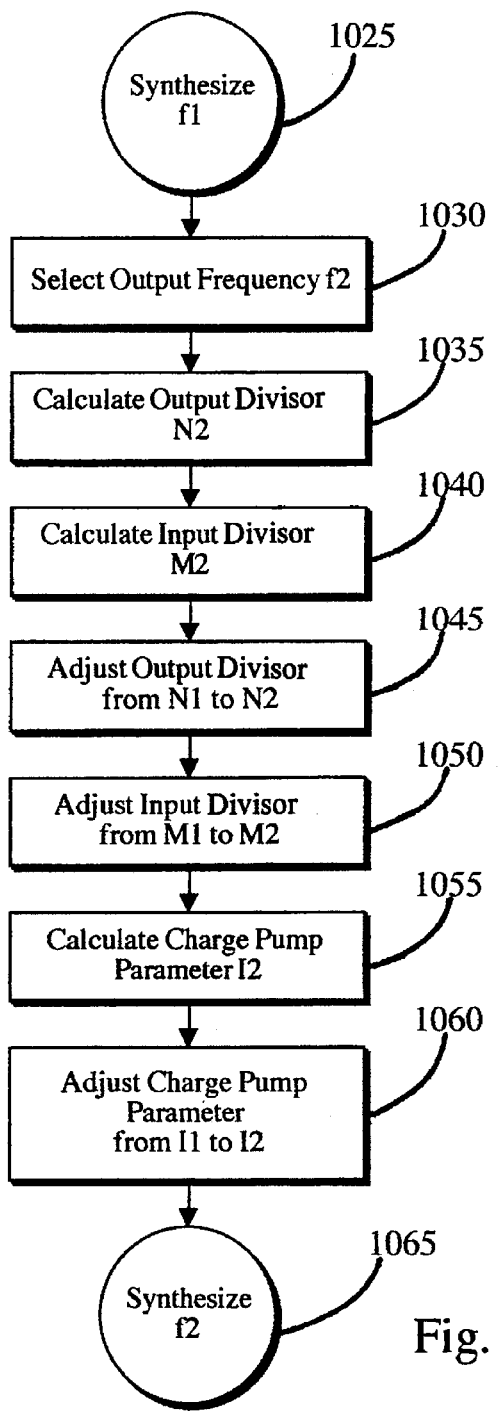
FIG. 12 illustrates another embodiment of a method for adjusting the output frequency and the loop bandwidth, natural frequency, and damping factor of a PLL in a frequency synthesizer.

FIG. 12 illustrates another embodiment of a method for adjusting the output frequency and the loop bandwidth, natural frequency, and damping factor of a PLL in a frequency synthesizer. In step 1025, the frequency synthesizer synthesizes an output signal having a first output frequency $f_1$. In step 1030, a second output frequency $f_2$ is selected for the output signal, in step 1035, an adjusted output divisor $N_2$ is calculated, and in step 1040, and adjusted input divisor $M_2$ is calculated. In step 1045, the output divisor of an output divider is adjusted from an output divisor $N_1$ associated with the first output frequency $f_1$ to the adjusted output divisor $N_2$, and in step 1050, the input divisor of an input divider is adjusted from an input divisor $M_1$ associated with the first output frequency $f_1$ to the adjusted input divisor $M_2$. Based upon the adjusted input and output divisors $M_2$ and $N_2$, an adjusted charge pump parameter $I_2$ is calculated to adjust the PLL loop bandwidth, natural frequency, and damping factor in step 1055. In step 1060, the charge pump parameter in the charge pump circuit is adjusted from a charge pump parameter $I_1$ associated with the first output frequency $f_1$ to the adjusted charge pump parameter $I_2$. After the adjustments have been made, the frequency synthesizer is adapted to synthesize the output signal having a second output frequency $f_2$, step 1065.

Figure 13:
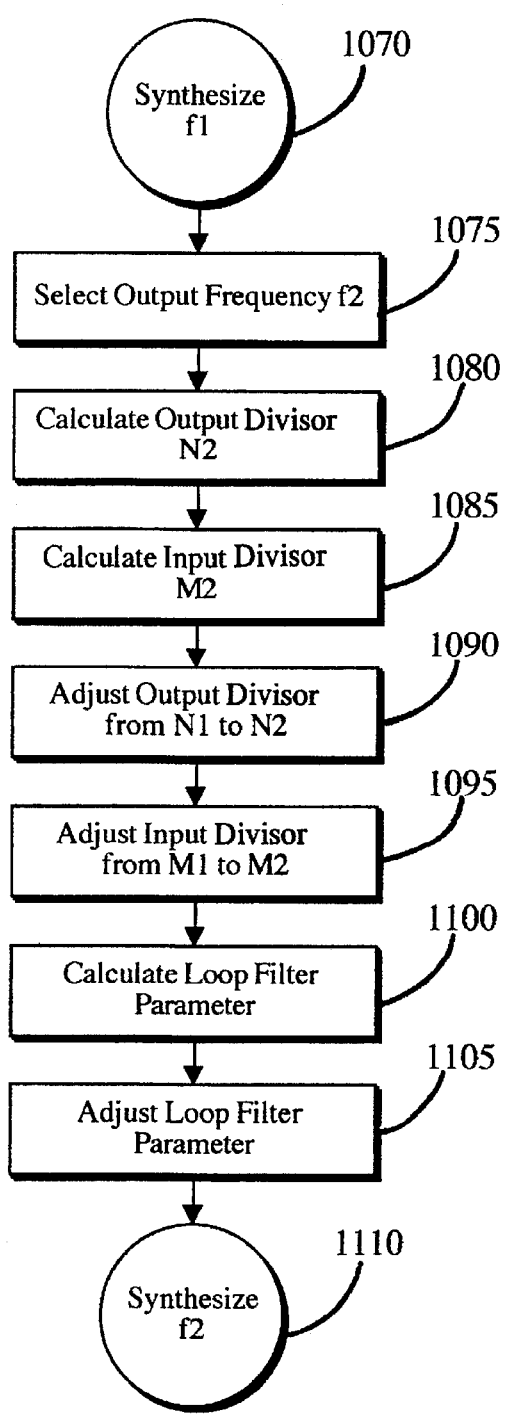
FIG. 13 illustrates another embodiment of a method for adjusting the output frequency and the loop bandwidth, natural frequency, and damping factor of a PLL in a frequency synthesizer.

FIG. 13 illustrates another embodiment of a method for adjusting the output frequency and the loop bandwidth, natural frequency, and damping factor of a PLL in a frequency synthesizer. In step 1070, the frequency synthesizer synthesizes an output signal having a first output frequency $f_1$. In step 1075, a second output frequency $f_2$ is selected for the output signal, in step 1080, an adjusted output divisor $N_2$ is calculated, and in step 1085, and adjusted input divisor $M_2$ is calculated. In step 1090, the output divisor of an output divider is adjusted from an output divisor $N_1$ associated with the first output frequency $f_1$ to the adjusted output divisor $N_2$, and in step 1095, the input divisor of an input divider is adjusted from an input divisor $M_1$ associated with the first output frequency $f_1$ to the adjusted input divisor $M_2$. Based upon the adjusted input and output divisors $M_2$ and $N_2$, loop filter parameters are calculated to adjust the PLL loop bandwidth, natural frequency, and damping factor, in step 1100 the loop filter parameters in the loop filter are adjusted, in step 1105. After the adjustments have been made, the frequency synthesizer is adapted to synthesize the output signal having a second output frequency $f_2$, step 1110.

Figure 14:
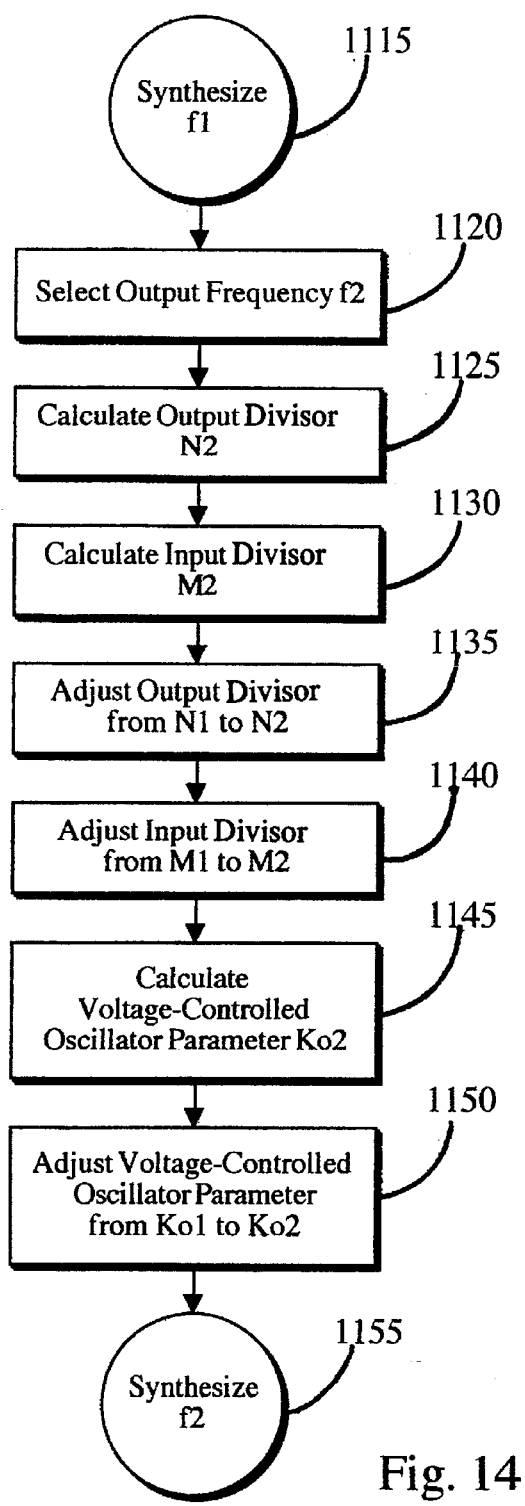
FIG. 14 illustrates another embodiment of a method for adjusting the output frequency and the loop bandwidth, natural frequency, and damping factor of a PLL in a frequency synthesizer.

FIG. 14 illustrates another embodiment of a method for adjusting the output frequency and the loop bandwidth, natural frequency, and damping factor of a PLL in a frequency synthesizer. In step 1115, the frequency synthesizer synthesizes an output signal having a first output frequency $f_1$. In step 1120, a second output frequency $f_2$ is selected for the output signal, in step 1125, an adjusted output divisor $N_2$ is calculated, and in step 1130, and adjusted input divisor $M_2$ is calculated. In step 1135, the output divisor of an output divider is adjusted from an output divisor $N_1$ associated with the first output frequency $f_1$ to the adjusted output divisor $N_2$, and in step 1140, the input divisor of an input divider is adjusted from an input divisor $M_1$ associated with the first output frequency $f_1$ to the adjusted input divisor $M_2$. In step 1145, based upon the adjusted input and output divisors $M_2$ and $N_2$, the voltage-controlled oscillator parameter $K_o$ is calculated to adjust the PLL loop bandwidth, natural frequency, and damping factor. In step 1150, the voltage-controlled oscillator parameter is adjusted from a voltage-controlled oscillator parameter $K_{o1}$ associated with the first output frequency $f_1$ to the adjusted voltage-controlled oscillator parameter $K_{o2}$. After the adjustments have been made, the frequency synthesizer is adapted to synthesize the output signal having a second output frequency $f_2$, step 1155.

In a preferred embodiment, the frequency synthesizer is formed on a monolithic integrated circuit. The values of the output divisor N and the charge pump parameter I are varied in order to obtain the desired frequency for the frequency synthesizer. The PLL dynamic characteristics are adjusted according to the following criteria:

a) the loop bandwidth K should remain from about 1 to 15% of $f_r/M$, and preferably about 10%;

b) the damping factor $\zeta$ should remain from about 0.5 to 2, and preferably about 1;

c) the loop filter capacitor C should be from about 50 pF to 500 pF, and preferably at about 250 pF;

d) the charge pump current I is adjustable from about 1 microamps to 1 mA, and preferably at about 100 microamps; and e) the VCO gain $K_o$ should be large enough to accommodate the desired operating frequency range. Of course, the values for the indicated variables will depend upon the particular application.

An embodiment of the present invention has been implemented incorporating the following values: R=5 KOhms, C=250 pF, I=100 microamps, and $K_o$=70 MHz/volt.

In one embodiment, the frequency synthesis range for the frequency synthesizer ranges from 0.3 MHz to 165 MHz. In a preferred embodiment, the frequency range ranges from 2 MHz to 100 MHz.

In the foregoing specification, the invention has been described with reference to specific exemplary embodiments thereof. It will, however, be evident that various modifications and changes may be made thereunto without departing from the broader spirit and scope of the invention as set forth in the claims. Many changes or modifications are readily envisioned, for example, using an active loop filter. Additionally multiple parameters can be adjusted in order to maintain the PLL dynamic characteristics. The specification and drawings are, accordingly, to be regarded in an illustrative rather than in a restrictive sense.

What is claimed is:

1. A frequency synthesizer, comprising:
a phase-locked loop adapted to generate an output signal having an output frequency from 0.3 MHz to 165 MHz, in response to an input signal having an input frequency, said phase-locked loop comprising:
a frequency divider, adapted to divide said output frequency of said output signal by a divisor to produce a divided output signal having a divided frequency;
a phase detector, coupled to said frequency divider, adapted to detect when said input signal leads said divided output signal and adapted to detect when said divided output signal leads said input signal, to produce a difference signal;
a charge pump circuit having a pump parameter, coupled to said phase detector, adapted to generate a charge pump signal in response to said difference signal and to said pump parameter;
a loop filter, coupled to said charge pump circuit, adapted to filter out high-frequency components from said charge pump signal to produce a filtered signal; and
a variable oscillator, coupled to said loop filter and to said output frequency divider, adapted to produce said output signal at said output frequency in response to said filtered signal; and
a phase-locked loop adjustment circuit, coupled to said frequency divider and to said charge pump circuit, said phase-locked loop adjustment circuit adapted to adjust said pump parameter in response to said divisor;
wherein said phase-locked loop and said phase-locked loop adjustment circuit are formed on a monolithic integrated circuit.

2. The frequency synthesizer of claim 1, wherein said divisor in said frequency divider is programmable.

3. The frequency synthesizer of claim 1, wherein said phase-locked loop adjustment circuit is a digital-to-analog converter.

4. The frequency synthesizer of claim 1, wherein said charge pump circuit comprises a current pump.

5. The frequency synthesizer of claim 1, wherein said variable oscillator comprises a voltage-controlled oscillator.

6. The frequency synthesizer of claim 1, wherein said output frequency ranges from 2 MHz to 100 MHz.

7. A frequency synthesizer, comprising:
a phase-locked loop adapted to generate an output signal n output frequency in response to an input signal having an input frequency, said phase-locked loop comprising:
an input frequency divider, adapted to divide said input frequency of said input signal by an input divisor to produce a divided input signal having a divided input frequency;
an output frequency divider, adapted to divide said output frequency of said output signal by an output divisor to produce a divided output signal having a divided output frequency;
a phase detector, coupled to said input frequency divider and to said output frequency divider, adapted to detect when said divided input signal leads said divided output signal and adapted to detect when said divided output signal leads said divided input signal to produce a difference signal;
a charge pump circuit having a pump parameter, coupled to said phase detector, adapted to generate a charge pump signal in response to said difference signal and said pump parameter;
a loop filter having a filter parameter, coupled to said charge pump circuit, adapted to filter out high-frequency components from said charge pump signal in response to said filter parameter to produce a filtered signal; and
a variable oscillator having an oscillator parameter, coupled to said loop filter and to said frequency divider, adapted to produce said output signal at said output frequency in response to said filtered signal and to said oscillator parameter; and
a phase-locked loop adjustment circuit, coupled to said input frequency divider, to said output frequency divider, to said charge pump circuit, to said loop filter, and to said variable oscillator, said phase-locked loop adjustment circuit adapted to adjust said pump parameter, said filter parameter, and said oscillator parameter, in response to said input divisor and to said output divisor.

8. The frequency synthesizer of claim 7, wherein said charge pump circuit comprises a current pump.

9. The frequency synthesizer of claim 7, wherein said variable oscillator comprises a voltage-controlled oscillator.

10. The frequency synthesizer of claim 7, wherein said output frequency ranges from 0.3 MHz to 165 MHz.

11. The frequency synthesizer of claim 7, wherein said output frequency ranges from 2 MHz to 100 MHz.

12. A method for adjusting an output signal of a frequency synthesizer from a first output frequency to a second output frequency, comprising the steps of:
adjusting an output frequency of a phase-locked loop from the first output frequency to a second output frequency; and
adjusting a loop bandwidth, a natural frequency, and damping factor of said phase-locked loop from values associated w the first output frequency to values associated with the second output frequency in response to the second output frequency;
wherein the first output frequency ranges from 0.3 MHz to 165 MHz, and the second output frequency ranges from 0.3 MHz to 165 MHz.

13. A method for adjusting an output signal of a frequency synthesizer from a first output frequency to a second output frequency, comprising the steps of:
adjusting an output divisor of an output frequency divider in a phase-locked loop from a first divisor associated with the first output frequency to a second divisor associated with the second output frequency; and adjusting a loop bandwidth, a natural frequency, and a damping factor of said phase-locked loop from values associated with the first output frequency to values associated with the second output frequency in response to said second divisor;

wherein the second output frequency ranges from 0.3 MHz to 165 MHz.

14. A method for adjusting a loop bandwidth, a natural frequency, and a damping factor of a phase-locked loop circuit in a frequency synthesizer, comprising the steps of:

selecting a second output frequency for an output signal in the range from 0.3 MHz to 165 MHz;

calculating an adjusted output divisor for an output frequency divider of the phase-locked loop circuit in response to said second output frequency;

adjusting an output divisor for said output frequency divider from a first output divisor associated with a first output frequency to said adjusted output divisor;

calculating an adjusted pump parameter for a charge pump circuit of the phase-locked loop in response to said adjusted output divisor; and adjusting a pump parameter for said charge pump circuit from a pump parameter associated with said first output frequency to said adjusted pump parameter.

15. A method for adjusting a loop bandwidth, a natural frequency, and a damping factor of a phase-locked loop circuit in a frequency synthesizer, comprising the steps of:

selecting a second output frequency for an output signal, the second output frequency within the range of 0.3 MHz to 165 MHz;

calculating an adjusted output divisor for an output frequency divider of the phase-locked loop circuit in response to said second output frequency;

adjusting an output divisor for said output frequency divider from a first output divisor associated with said first output frequency to said adjusted output divisor;

calculating an adjusted filter parameter for a loop filter of the phase-locked loop in response to said adjusted output divisor; and adjusting a filter parameter for said loop filter from a first filter parameter associated with said first output frequency to said adjusted output parameter.

16. A method for adjusting a loop bandwidth, a natural frequency, and a damping factor of a phase-locked loop circuit in a frequency synthesizer, comprising the steps of:

selecting a second output frequency for an output signal, the second output frequency within the range of 0.3 MHz to 165 MHz;

calculating an adjusted output divisor for an output frequency divider of the phase-locked loop circuit in response to said second output frequency;

adjusting an output divisor for said output frequency divider from a first output divisor associated with said first output frequency to said adjusted output divisor;

calculating an adjusted oscillator parameter for a variable oscillator of the phase-locked loop in response to said adjusted output divisor; and adjusting an oscillator parameter for said variable oscillator from a first oscillator parameter associated with said first output frequency to said adjusted oscillator parameter.

17. A method for adjusting a loop bandwidth, a natural frequency, and a damping factor of a phase-locked loop circuit in a frequency synthesizer, comprising the steps of:

selecting a second output frequency for an output signal;

calculating an adjusted output divisor for an output frequency divider of the phase-locked loop circuit in response to said second output frequency;

calculating an adjusted input divisor for an input frequency divider of the phase-locked loop circuit in response to said second output frequency;

adjusting an output divisor for said output frequency divider from a first output divisor associated with said first output frequency to said adjusted output divisor;

adjusting an input divisor for said output frequency divider from a first input divisor associated with said first output frequency to said adjusted input divisor;

calculating an adjusted pump parameter for a charge pump circuit of the phase-locked loop in response to said adjusted input and adjusted output divisors;

adjusting a pump parameter for said charge pump circuit from a first pump parameter associated with said first output frequency to said adjusted pump parameter;

calculating an adjusted filter parameter for a loop filter of the phase-locked loop in response to said adjusted input and adjusted output divisors;

adjusting a filter parameter for said loop filter from a first filter parameter associated with said first output frequency to said adjusted filter parameter;

calculating an adjusted oscillator parameter for a variable oscillator of the phase-locked loop in response to said adjusted input and adjusted output divisors; and adjusting an oscillator parameter for said variable oscillator from a first oscillator parameter associated with said first output frequency to said adjusted oscillator parameter.

* * * * *